United States Patent
Feng et al.

(10) Patent No.: US 10,333,522 B2
(45) Date of Patent: Jun. 25, 2019

(54) SELECTION OF MULTIPLE CONFIGURATION SETTINGS USING A SINGLE CONFIGURATION TERMINAL

(71) Applicant: DIALOG SEMICONDUCTOR INC., Campbell, CA (US)

(72) Inventors: Guang Feng, Campbell, CA (US); Xiaoyan Wang, Campbell, CA (US); Nan Shi, Campbell, CA (US)

(73) Assignee: DIALOG SEMICONDUCTOR INC., Campbell, CA (US)

( * ) Notice: Subject to any disclaimer, the term of this patent is extended or adjusted under 35 U.S.C. 154(b) by 15 days.

(21) Appl. No.: 15/826,526

(22) Filed: Nov. 29, 2017

(65) Prior Publication Data

US 2018/0083636 A1 Mar. 22, 2018

Related U.S. Application Data

(63) Continuation of application No. PCT/US2015/051535, filed on Sep. 22, 2015.

(51) Int. Cl.
*H03K 19/177* (2006.01)
*H03K 19/0175* (2006.01)
*H03K 5/1532* (2006.01)

(52) U.S. Cl.
CPC ..... *H03K 19/17796* (2013.01); *H03K 5/1532* (2013.01); *H03K 19/0175* (2013.01); *H03K 19/17764* (2013.01)

(58) Field of Classification Search
None
See application file for complete search history.

(56) References Cited

U.S. PATENT DOCUMENTS

| 8,917,070 B2 * | 12/2014 | El-Nozahi | G05F 1/565 323/273 |
| 2003/0023777 A1 | 1/2003 | Fields et al. | |

(Continued)

OTHER PUBLICATIONS

PCT Search Report and Written Opinion dated Aug. 12, 2016 from corresponding International Application No. PCT/US2015/051535 filed Sep. 22, 2015.

(Continued)

*Primary Examiner* — Minh D A
*Assistant Examiner* — James H Cho
(74) *Attorney, Agent, or Firm* — Haynes and Boone, LLP (57) ABSTRACT

A single configuration terminal of a device is used to configure multiple operating parameters of the device based on a resistor and a capacitor selectively connected to the configuration terminal. The device includes a detection circuit configured to monitor a voltage signal at the configuration terminal to determine multiple values in response to a regulated current source providing a current to the configuration terminal selectively connected to the resistor and the capacitor in parallel, and configure multiple operating parameters based on the determined values. A method for configuring operating parameters using a single configuration terminal of a device includes providing a current to the configuration terminal selectively connected to a resistor and a capacitor in parallel, monitoring a voltage signal at the configuration terminal, determining multiple values based on the monitoring, and configuring multiple operating parameter based on the determined values.

16 Claims, 6 Drawing Sheets

(56) References Cited

U.S. PATENT DOCUMENTS

| | | | |
|---|---|---|---|
| 2004/0036487 A1* | 2/2004 | Heremans | G01N 27/06 324/698 |
| 2008/0042701 A1 | 2/2008 | Weiss et al. | |
| 2014/0055151 A1 | 2/2014 | Nguyen | |
| 2015/0160148 A1* | 6/2015 | Stanley | G01N 27/228 324/686 |
| 2015/0251542 A1* | 9/2015 | Mensah-Brown | B60L 11/005 307/10.1 |

OTHER PUBLICATIONS

Written Opinion of the International Preliminary Examining Authority dated Aug. 14, 2017 from corresponding International Application No. PCT/US2015/051535 filed Sep. 22, 2015.

* cited by examiner

SELECTION OF MULTIPLE CONFIGURATION SETTINGS USING A SINGLE CONFIGURATION TERMINAL

CROSS-REFERENCE TO RELATED APPLICATIONS

This application is a continuation of International Application No. PCT/US2015/051535 filed Sep. 22, 2015, which is hereby incorporated by reference in its entirety.

TECHNICAL FIELD

This application relates to devices with configurable parameters, and more particularly to configuring parameters of devices using configuration terminals.

BACKGROUND

Many configurable devices such as integrated circuits or other semiconductor devices provide multiple configuration options that may be set by users. Configurable devices with such configuration options allow semiconductor suppliers to produce programmable devices of a given design to be used in multiple applications in lieu of producing devices of a specific design customized for each application. Further, this configuration provides greater design flexibility when using the configurable devices.

Figure 1:
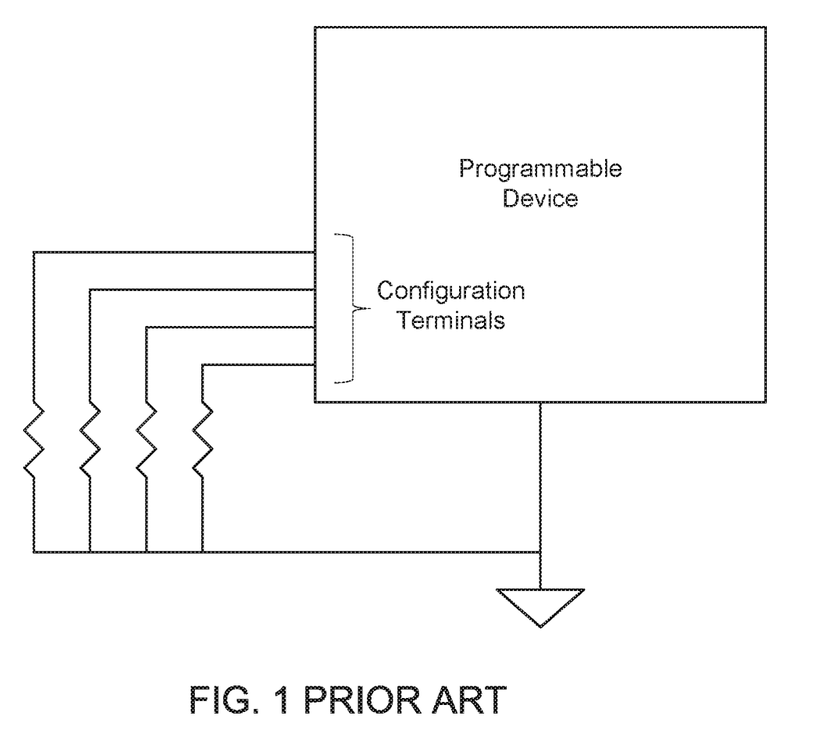
FIG. 1 shows a diagram of a programmable device that uses a prior art technique for configuring parameters of the programmable device.
Figure 2:
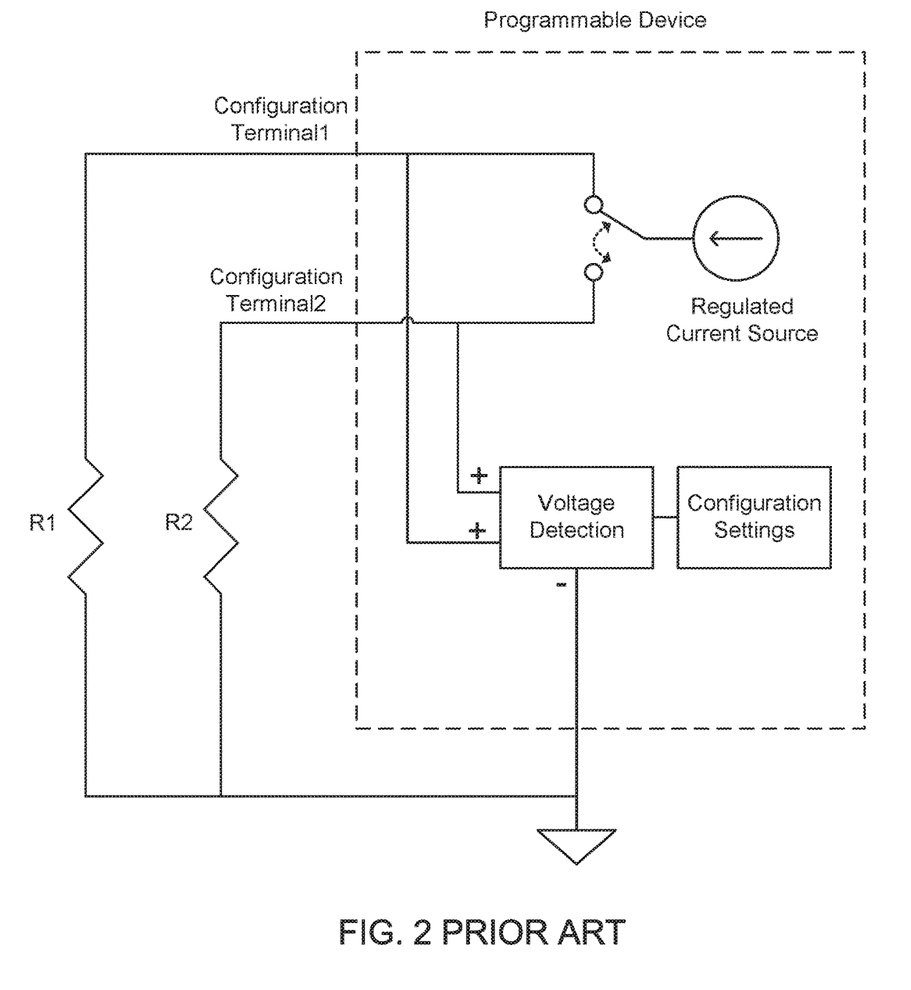
FIG. 2 shows a diagram of a programmable device that utilize a prior art mechanism of determining values of configuration resistors connected to configuration terminals of the programmable device.

A programmable device may have one or more parameters such as operating parameters that may each be configured to a selected setting. Configuration terminals such as pins or bumps may be utilized to configure the parameters of the programmable device. As illustrated in FIG. 1, a prior art technique for configuring parameters of a programmable device uses one configuration terminal for each parameter. Each configuration terminal is connected to a configuration resistor that is external to the programmable device. A resistor value of each configuration resistor is used to select the desired setting for a corresponding parameter. FIG. 2 illustrates a prior art mechanism used to determine the resistor values of the configuration resistors to determine the desired setting for each parameter. A regulated current source may be connected to one of the configuration terminals. Since the current from that configuration terminal to ground is known, the resistor value of the configuration resistor connected to that configuration terminal can be determined by measuring the voltage at the configuration terminal and applying Ohm's law. Similarly, by connecting the current source to the other configuration terminal, the resistor value of the other configuration resistor may be determined. There are many examples of parameters that may be configured. For example, as shown in an example configuration table 1 below, the parameters may include two operational parameters—a shutdown temperature for thermal protection and an operating frequency.

TABLE 1

| Terminal | Parameter | Setting | Resistor |
| --- | --- | --- | --- |
| 1 | Shutdown Temperature (Thermal Protection) | 50° C. | 50K Ohms |
| | | 60° C. | 75K Ohms |
| | | 70° C. | 100K Ohms |
| 2 | Operating Frequency | 100 MHz | 50K Ohms |
| | | 150 MHz | 75K Ohms |
| | | 200 MHz | 100K Ohms |

The desired setting for a parameter may be selected by connecting a resistor with a resistor value associated with the desired setting to the configuration terminal dedicated to that parameter. FIG. 2 illustrates an example with two configuration terminals, but this mechanism may be used with more configuration terminals and configuration resistors.

Although this technique is simple and reliable, it requires a dedicated configuration terminal for each parameter. This may increases the cost of programmable devices, and may also increase the size of programmable devices. For example, controllers used in power control and lighting devices have very few pins due to cost and size constraints.

Accordingly, there is a need in the art for improved techniques for configuring parameters of programmable devices that allow multiple parameters to be configured using fewer configuration terminals.

SUMMARY

To address the need in the art for improved techniques for configuring parameters using configuration terminals, systems, devices, and methods for selecting multiple configuration settings using a single configuration terminal are provided.

A programmable device (e.g., an integrated circuit or other semiconductor device) includes one or more configuration terminals (e.g., pins, bumps, or other terminals), and at least one of the configuration terminals may be used to select multiple configuration settings. A single configuration terminal of the programmable device is selectively connected to a configuration resistor and a configuration capacitor in parallel. The programmable device configures multiple operating parameters using that configuration terminal based on the configuration resistor and the configuration capacitor.

The programmable device determines two or more values, which may in turn be determined by the configuration resistor and/or the configuration capacitor. The two or more values may include a resistor value, a capacitor value, a resistor-capacitor (RC) time constant value, and/or other values that depend on the configuration resistor and/or the configuration capacitor. The resistor value may be the resistance of the configuration resistor or a value associated with the resistance. The capacitor value may be the capacitance of the configuration capacitor or a value associated with the capacitance. The RC time constant value may be the RC time constant, which is the product of the resistance and the capacitance, or a value associated with the RC time constant.

The programmable device determines the two or more values by monitoring a voltage signal at the configuration terminal. A regulated current source provides a current to the configuration terminal. A voltage signal at the configuration terminal rises according to the RC time constant based on the resistor value and the capacitor value. When the voltage signal reaches a peak voltage, also referred to as the direct current (DC) voltage or DC level, the programmable device may determine the peak voltage and determine the resistor value. The programmable device may determine the resistor value using the current of the regulated current source and the peak voltage.

When the regulated current source is enabled, the voltage signal will rise according to the RC time constant. Further, when the regulated current source is disabled, the voltage signal will fall according to the RC time constant. Since the resistor value is known based on the peak voltage, the programmable device may determine the capacitor value and/or the RC time constant value by determining a rise time of the voltage signal (e.g., from zero or a predetermined voltage to a threshold voltage) during a rise of the voltage signal and/or a decay time of the voltage signal (e.g., from the peak voltage or a predetermined voltage to a threshold voltage) during a fall of the voltage signal. Alternatively, the programmable device may determine the capacitor value and/or the RC time constant value by measuring two voltages a fixed time apart during the rise or fall of the voltage signal. The programmable device may determine the capacitor value and/or the RC time constant value using the current of the regulated current source, the peak voltage, the resistor value, and/or at least one of the rise time, the decay time, or the two measured voltages.

One value such as the resistor value may be used to select a configuration setting for one parameter, and another value, such as the capacitor value or the RC time period value may be used to select a configuration setting for another parameter. Alternatively, a combination of two values may be used to select configuration settings for two or more parameters such as by mapping each combination with a pre-set configuration settings for the two or more parameters.

Accordingly, a single configuration terminal may be used to configure multiple parameters such that the number of configuration terminals required to configure parameters of programmable devices may be reduced, which advantageously reduces the cost and/or size of the programmable devices. These advantageous features may be better appreciated through a consideration of the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Systems, devices, and methods for configuring multiple parameters using a configuration terminal are provided.

Figure 3:
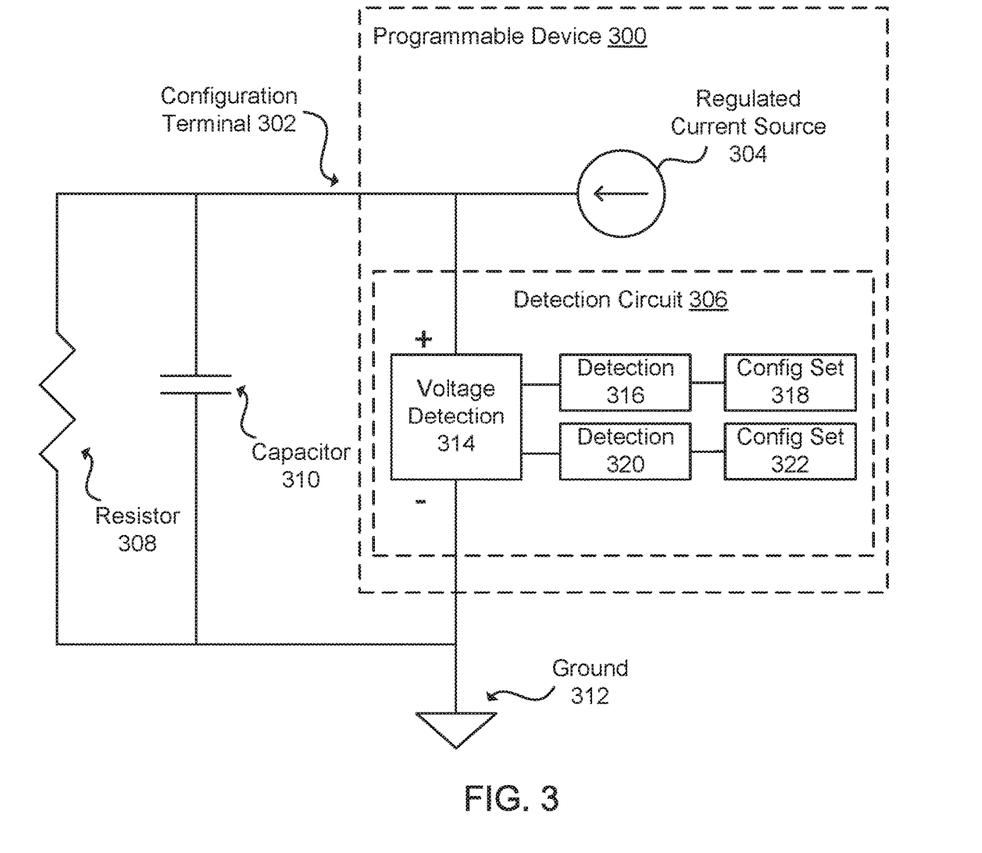
FIG. 3 shows a programmable device that configures multiple parameters using a configuration terminal in accordance with an embodiment of the disclosure.

FIG. 3 shows a programmable device 300 such as an integrated circuit or other semiconductor device that configures multiple parameters using a configuration terminal 302 in accordance with an embodiment of the disclosure. Programmable device 300 may include at least one configuration terminal 302, a regulated current source 304, and a detection circuit 306. Although only one configuration terminal 302 is shown, programmable device 300 may include more than one configuration terminals 302 and other types of terminals. Configuration terminal 302 may be a pin, a bump, or other terminal. Regulated current source 304 is configured to selectively provide a regulated current to configuration terminal 302. Regulated current source 304 may be a programmable regulated current source or other regulated current source. In alternative embodiments, regulated current source 304 may be a part of detection circuit 306 or provided by a circuit or device external to programmable device 300.

A resistor such as a configuration resistor 308 and/or a capacitor such as a configuration capacitor 310 are selectively connected to configuration terminal 302 to configure multiple parameters. One terminal of resistor 308 may be connected to configuration terminal 302 and the other terminal of resistor 308 may be connected to a ground 312. Similarly, one terminal of capacitor 310 may be connected to configuration terminal 302 and the other terminal of capacitor 310 may be connected to ground 312, such that resistor 308 and capacitor 310 are connected in parallel. Resistor 308 and capacitor 310 may together determine a resistor-capacitor (RC) time constant, also referred to as a RC product, which is the product of the resistance of resistor 308 and the capacitance of capacitor 310.

Detection circuit 306 may include a voltage detection component 314 configured to monitor a voltage signal at configuration terminal 302, such as across configuration terminal 302 and ground 312. Detection circuit 306 may also include a resistor detection component 316 that determines a resistor value to configure a parameter to one of a plurality of configuration settings 318 for a parameter. By determining the resistor value, detection circuit 306 may identify or otherwise detect resistor 308. Detection circuit 306 may further include a capacitor or RC product (RC time constant) detection component 320 that determines a capacitor value or an RC time constant value, also referred to as an RC product value, to configure another parameter. By determining the capacitor value or the RC product value, capacitor/RC product detection component 320 may identify or otherwise detect capacitor 310.

The resistor value may be the resistance of resistor 308 or a value proportional to or otherwise associated with the resistance of resistor 308. The capacitor value may be the capacitance of capacitor 310 or a value proportional to or otherwise associated with the capacitance of capacitor 310. The RC time constant value may be an RC time constant or a value proportional to or otherwise associated with the RC time constant. For example, the resistor value, the capacitor value, and/or the RC time constant value may each be digital values generated in response to regulated current source 304 providing a current to configuration terminal 302 and measuring a voltage signal at configuration terminal.

In alternative embodiments, detection component 316 and/or detection component 320 may determine other values that depend on resistor 308 and/or capacitor 310. Although two detection components 316 and 320 are shown, detection circuit 306 may include more than two detection components.

Detection component 316 and/or detection component 320 may be separate from voltage detection component 314 or may be implemented by voltage detection component 314. Detection circuit 306 may include one or more comparators and/or analog-to-digital circuits (ADCs). For example, voltage detection component 314, detection component 316, and/or detection component 320 may each include one or more comparators and/or ADCs.

Figure 4A:
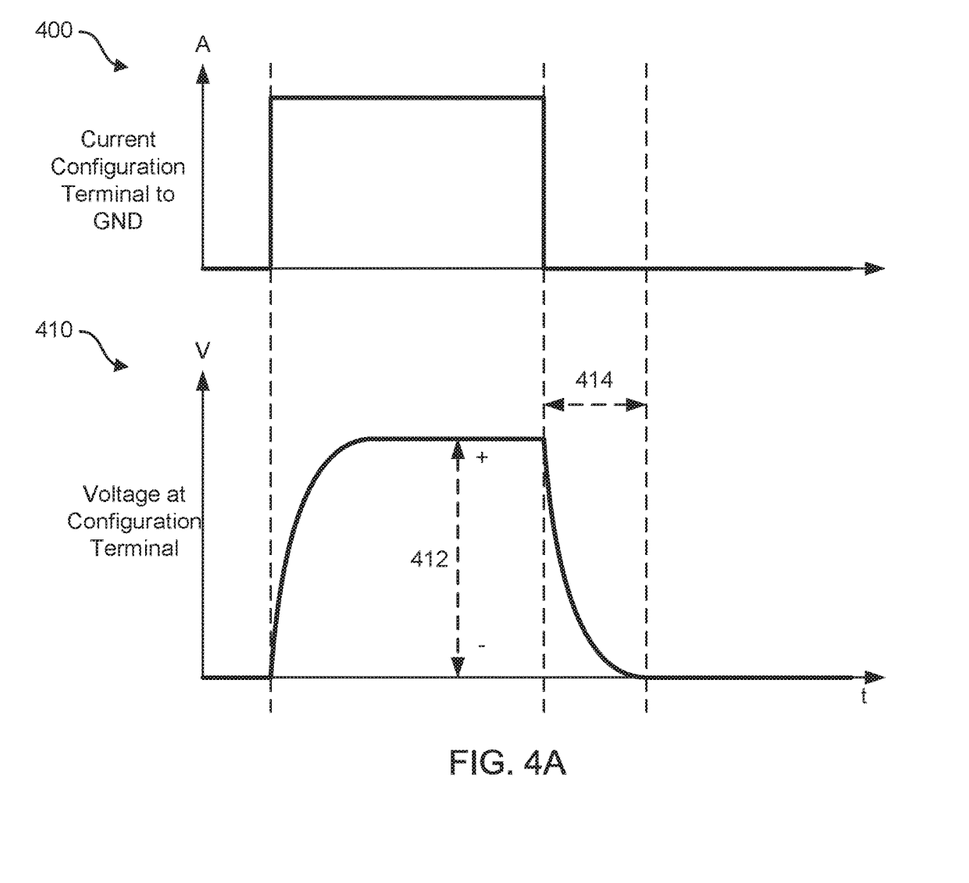
FIGS. 4A-B illustrate waveforms at a configuration terminal used to configure multiple parameters of a programmable device in accordance with an embodiment of the disclosure.
Figure 4B:
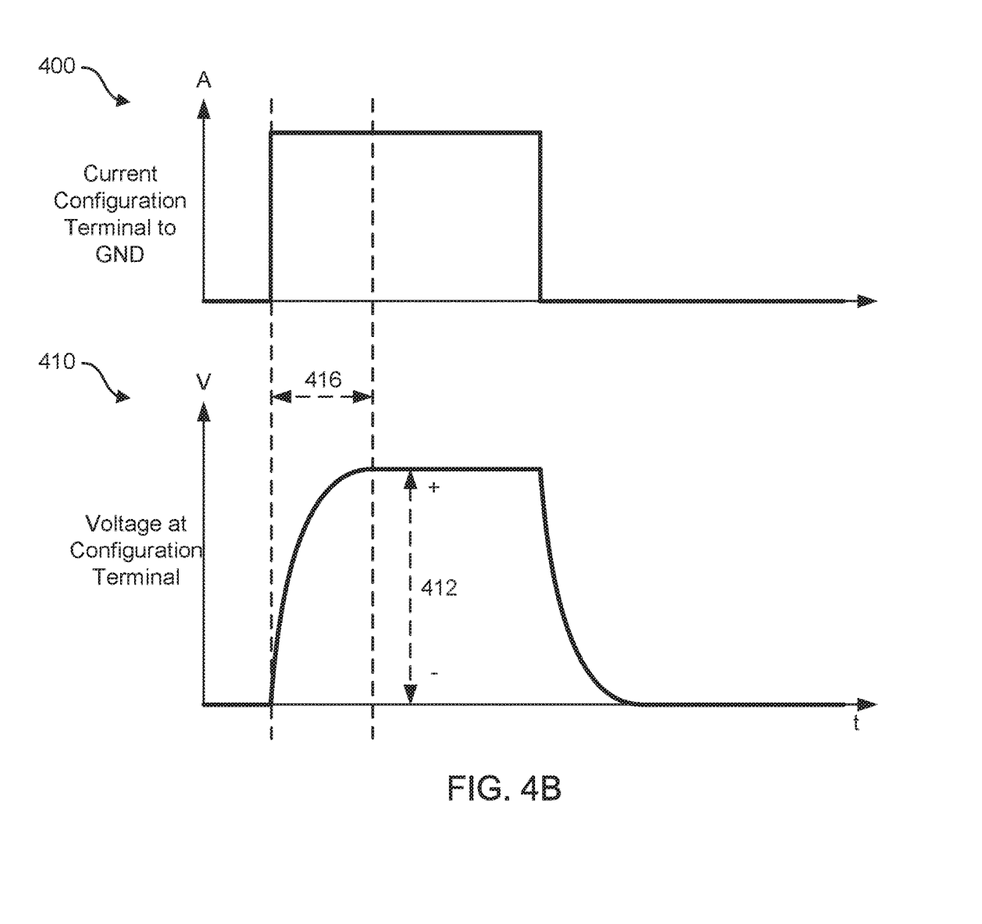

When regulated current source 304 provides a current for a time period to configuration terminal 302, as illustrated by a current waveform 400 in FIGS. 4A-B, detection circuit 306 (e.g., using voltage detection component 314) monitors a voltage signal at configuration terminal 302, as illustrated by a voltage waveform 410 in FIGS. 4A-B. When regulated current source 304 starts providing the current (e.g., in response to detection circuit 306 enabling regulated current source 304), the voltage signal rises according to the RC time constant. The voltage signal reaches a peak voltage 412, also referred to as the direct current (DC) voltage or DC level, and stays there until regulated current source 304 stops providing the current (e.g., in response to detection circuit 306 disabling regulated current source 304). When regulated current source 304 stops providing the current, the voltage signal falls according to the RC time constant.

When the voltage signal reaches the peak voltage 412, detection circuit 306 (e.g., using resistor detection component 316) may determine the peak voltage 412 and determine the resistor value. Detection circuit 306 may determine the resistor value using the value of the current provided by regulated current source 304 and the value of peak voltage 412.

Detection circuit 306 (e.g., using capacitor/RC product detection component 320) may determine another value, such as the capacitor value and/or the RC time constant value based on a further measurement and/or the resistor value. In one embodiment, detection circuit 306 determines a decay time 414 in response to regulated current source 304 stopping the providing of the current. Decay time 414 may be the time it takes for the voltage signal to fall from peak voltage 412 to zero as shown in FIG. 4A, from peak voltage 412 to a threshold voltage, from a predetermined voltage to a threshold voltage, or other time period associated with the fall of the voltage signal. Detection circuit 306 may determine the capacitor value based on decay time 414 and/or the resistor value. Alternatively, or in addition, detection circuit 306 may determine the RC time constant value based on decay time 414 and/or the resistor value.

In another embodiment, detection circuit 306 determines a rise time 416 in response to regulated current source 304 starting the providing of the current. Rise time may be the time it takes for the voltage signal to rise from zero to peak voltage 412 as shown in FIG. 4B, from a predetermined voltage to peak voltage 412, from zero to a threshold voltage, from a predetermined voltage to a threshold voltage, other time period associated with the rise of the voltage signal. Detection circuit 306 may determine the capacitor value based on rise time 416 and/or the resistor value. Alternatively, or in addition, detection circuit 306 may determine the RC time constant value based on rise time 416 and/or the resistor value.

In a further embodiment, detection circuit 306 determines the capacitor value and/or the RC time constant value by measuring two voltages a fixed time apart during the rise or fall of the voltage signal. Detection circuit 306 may determine the capacitor value based on the two voltages and/or the resistor value. Alternatively, or in addition, detection circuit 306 may determine the RC time constant value based on the two voltages and/or the resistor value.

One value such as the resistor value may be used to configure one parameter to configuration setting 318. Another value such as the capacitor value or the RC time period value may be used to configure another parameter to configuration setting 322. Alternatively, a combination of two values may be used to configure one parameter to configuration setting 318 and another parameter to configuration setting 322 such as by mapping each combination with pre-set configuration settings for the two parameters. Each combination may be associated with a configuration setting for one parameter and another configuration setting for the other parameter. The combinations may further be associated with a configuration setting for a third parameter. In an example, there may be 4 resistors to select from and 3 capacitors to select from, resulting in an array of 12 combinations of resistor and capacitor. The array of 12 combinations may be mapped to a set of configuration settings (e.g., a pair of configuration settings if there are two parameters).

Accordingly, detection circuit 306 may determine two or more values (e.g., the resistor value, the capacitor value, the RC time constant value, or other value) by monitoring the voltage signal at configuration terminal 302 in response to regulated current source 304 providing a current to configuration terminal 302. Detection circuit 306 may then set two or more parameters based on the two or more values.

In one embodiment, an end product designer may select resistor 308 among a group of resistors and capacitor 310 among a group of capacitors based on the settings for the parameters that the end product designer desires. Each of the resistors (e.g., though the resistor value of the resistor) in the group of resistors may be associated with a setting (e.g., configuration setting 318) for a parameter. Each of the capacitors (e.g., though the capacitor value of the capacitor) in the group of capacitors may be associated with a setting (e.g., configuration setting 322) for another parameter.

In an example, as shown in an example configuration table 2 below, the parameters may include two operating parameters, such as a shutdown temperature for thermal protection and an operating frequency, that are configured based on selected resistor 308 and selected capacitor 310. An end product designer may look up configuration table 2 or a datasheet regarding how configuration parameters are set. The end product designer may then select resistor 308 among a group of resistors based on the desired setting for the shutdown temperature, and select capacitor 310 among a group of capacitors based on the desired setting for the operating frequency. Accordingly, the desired settings for two parameters may be selected by connecting resistor 308 and capacitor 310 to a single configuration terminal 302.

TABLE 2

| Terminal | Parameter | Setting | Resistor | Capacitor |
|---|---|---|---|---|
| 1 | Shutdown Temperature (Thermal Protection) | 50° C. | 50K Ohms | N/A |
|  |  | 60° C. | 75K Ohms | N/A |
|  |  | 70° C. | 100K Ohms | N/A |
| 1 | Operating Frequency | 50 MHz | N/A | No Capacitor |
|  |  | 100 MHz | N/A | 47 pF |
|  |  | 150 MHz | N/A | 100 pF |
|  |  | 200 MHz | N/A | 220 pF |

In another embodiment, each resistor (e.g., through the resistor value of the resistor) in a group of resistors may be associated with a setting (e.g., configuration setting 318) for a parameter, and each RC product (e.g., through the RC product value) in a group of RC products may be associated with a setting (e.g., configuration setting 322) for another parameter.

For example, as shown in an example configuration table 3 below, the parameters may include two operating parameters, such as a shutdown temperature and an operating frequency, that are configured based on selected resistor 308 and an RC product, which in turn depends on selected resistor 308 and selected capacitor 310. An end product designer may look up configuration table 3 or a datasheet regarding how configuration parameters are set. The end product designer may then select resistor 308 among a group of resistors based on the desired setting for the shutdown temperature, identify an RC product based on the desired setting for the operating frequency, and select capacitor 310 based on the identified RC product and selected resistor 308.

TABLE 3

| Operating Frequency → | | 200 MHz | 150 MHz | 100 MHz | 50 MHz |
|---|---|---|---|---|---|
| Shutdown Temp. ↓ | | RC product 100 uSec | RC product 33 uSec | RC product 10 uSec | RC product 0 |
| 50° C. | Select Resistor 10K | Select Capacitor 10 nF | Select Capacitor 3.3 nF | Select Capacitor 1 nF | Select Capacitor 0 |
| 60° C. | Select Resistor 33K | Select Capacitor 3.3 nF | Select Capacitor 1 nF | Select Capacitor 330 pF | Select Capacitor 0 |
| 70° C. | Select Resistor 100K | Select Capacitor 1 nF | Select Capacitor 330 pF | Select Capacitor 100 pF | Select Capacitor 0 |

In a further embodiment, each capacitor (e.g., through capacitor value) in a group of capacitors may be associated with a setting (e.g., configuration setting 318) for one parameter, and each RC product (e.g., through the RC product value) in a group of RC products may be associated with a setting (e.g., configuration setting 322) for another parameter. In other embodiments, one or more values that depend on resistor 308 and/or capacitor 310 other than the resistor value, the capacitor value, or the RC product value may be determined and used to configure one or more corresponding parameters.

Figure 5:
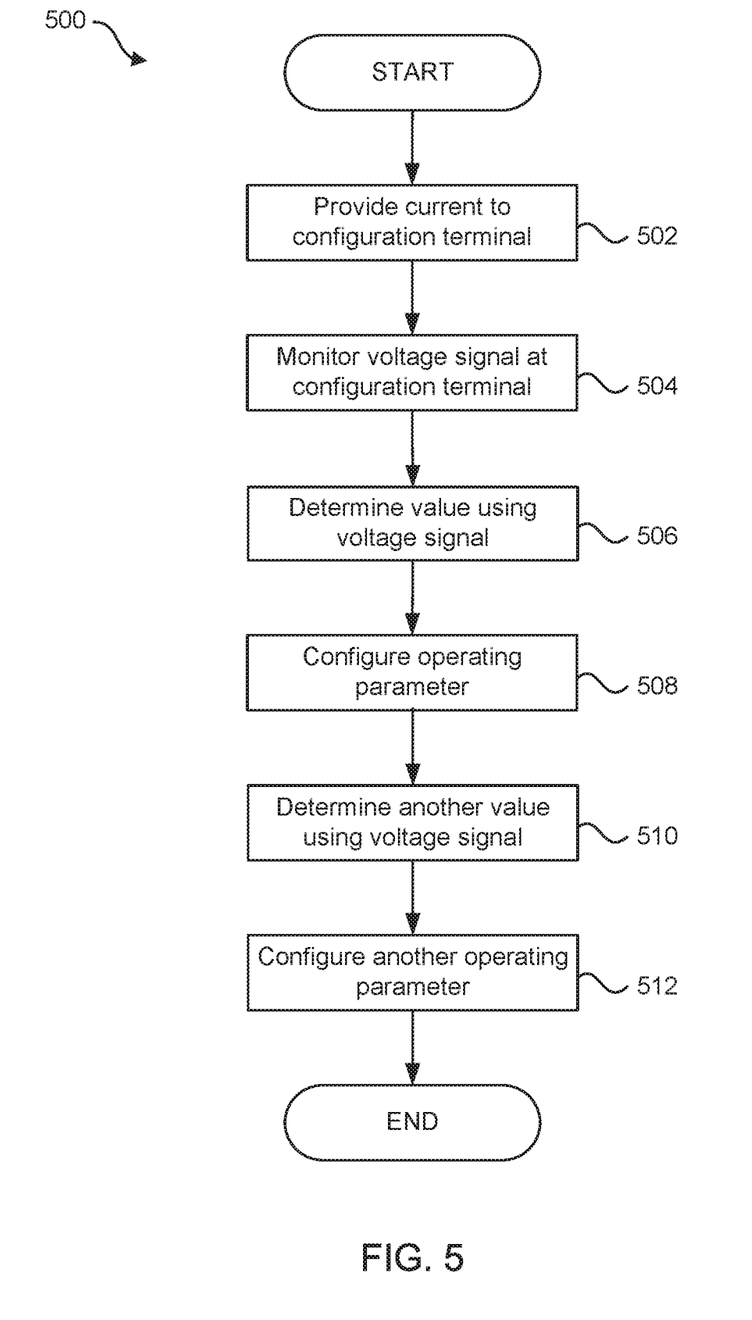
FIG. 5 illustrates an operation flow for configuring multiple parameters of a programmable device using a configuration terminal in accordance with an embodiment of the disclosure.

FIG. 5 illustrates an operation flow 500 for configuring multiple parameters of a programmable device such as programmable device 300 using a configuration terminal such as configuration terminal 302 (shown in FIG. 3) in accordance with an embodiment of the disclosure.

At block 502, programmable device 300 selectively provides a current to configuration terminal 302. Programmable device 300 may control regulated current source 304 (shown in FIG. 3) to start and stop providing the current to configuration terminal 302. Configuration terminal 302 is connected to a resistor such as resistor 308 and a capacitor such as capacitor 310 (shown in FIG. 3) in parallel or in series. Resistor 308 and capacitor 310 may have been selected and connected by an end product designer based on configuration settings desired by the end product designer.

At block 504, programmable device 300 monitors a voltage signal at configuration terminal 302. Programmable device 300 may use detection circuit 306 (shown in FIG. 3) to sense, measure, detect, compare, or otherwise monitor the voltage signal in response to regulated current source 304 providing the current.

At block 506, programmable device 300 determines a value based on monitoring the voltage signal. While the voltage signal is at peak voltage 412 (shown in FIG. 4A-B), programmable device 300 may determine peak voltage 412 and determine the resistor value based on peak voltage 412.

At block 508, programmable device 300 configures a parameter to a configuration setting. Programmable device 300 may configure an operating parameter based on the resistor value determined at block 506.

At block 510, programmable device 300 determines another value based on monitoring the voltage signal. As the resistor value is determined at block 506, another value such as the capacitor value or the RC time constant value may be determined using the rising or falling of the voltage signal, for example, by measuring a rate of the change of the voltage signal or a time period associated with the rising or falling of the voltage signal.

The capacitor value or the RC time constant value may be determined by monitoring the voltage signal as it falls according the RC time constant when regulated current source 304 stops providing the current. During a fall of the voltage signal, programmable device 300 may determine a decay time of the voltage signal from peak voltage 412 or a predetermined voltage to a threshold voltage, or two voltages measured a fixed time apart.

Alternatively, the capacitor value or the RC time constant value may be determined by monitoring the voltage signal as it rises according to the RC time constant when regulated current source 304 starts providing the current. During a rise of the voltage signal, programmable device 300 may determine a rise time of the voltage signal to a threshold voltage, or measure two voltages measured a fixed time apart.

At block 512, programmable device 300 configures another parameter to another configuration setting. Programmable device 300 may configure the other operating parameter based on the capacitor value or the RC time constant value determined at block 510.

A single configuration terminal such as configuration terminal 302 may thus be used to configure multiple parameters. When an end product designer selects resistor 308 and capacitor 310 and connects them in parallel to configuration terminal 302, programmable device 300 may detect two values, such as the resistor value of resistor 308 and the capacitor value of capacitor 310. Programmable device 300 may configure one parameter to a desired setting based on one of the two values, or a combination of the two values. Further, programmable device 300 may configure another parameter to a desired setting based on the other of the two values, or the combination of the two values. In further embodiments, one or more additional values may be determined based on the voltage signal, and one or more additional parameters may be set to a desired setting based on the additional values.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A device with configurable operating parameters, comprising:
 a configuration terminal;
 a regulated current source; and
 a detection circuit configured to:
  in response to the regulated current source providing a current to the configuration terminal, which is connected to a resistor and a capacitor in parallel, monitor a voltage signal at the configuration terminal to determine a first value and a second value, the first value being determined by a resistor detection component configured to determine a resistance value associated with the resistor, and the second value being determined by a capacitor detection component configured to determine a capacitance value associated with the capacitor; and configure a first operating parameter based on the resistance value and a second operating parameter based on the capacitance value or a combination of the resistance value and the capacitance value.

2. The device of claim 1, wherein the combination of the resistance value and the capacitance value is a resistor-capacitor (RC) time constant associated with the resistor and the capacitor, wherein the RC time constant is a product of the resistance value and a capacitance value of the capacitor.

3. The device of claim 1, wherein the detection circuit is configured to monitor the voltage signal to determine a peak voltage, wherein the first value is based on the peak voltage.

4. The device of claim 1, wherein the detection circuit is configured to monitor the voltage signal to determine a decay time from a peak voltage or a predetermined voltage to a threshold voltage during a fall of the voltage signal, wherein the second value is based on the decay time.

5. The device of claim 1, wherein the detection circuit is configured to monitor the voltage signal to determine a rise time to a threshold voltage during a rise of the voltage signal, wherein the second value is based on the rise time.

6. The device of claim 1, wherein the detection circuit is configured to monitor the voltage signal to measure two voltages a fixed time apart during a rise or fall of the voltage signal, wherein the second value is based on the two voltages.

7. The device of claim 1, wherein the detection circuit is configured to:

configure the first operating parameter to a first setting associated with a combination of the first value and the second value; and configure the second operating parameter to a second setting associated with the first value, the second value, or the combination.

8. The device of claim 1, wherein the detection circuit comprises an analog-to-digital circuit (ADC) or a comparator configured to monitor the voltage signal.

9. A method for configuring operating parameters of a device, comprising:

providing a current to a configuration terminal, which is connected to a resistor and a capacitor in parallel;

monitoring a voltage signal at the configuration terminal;

determining a first value and a second value based on the monitoring, the first value being determined by a resistor detection component for determining a resistance value associated with the resistor, and the second value being determined by a capacitor detection component for determining a capacitance value associated with the capacitor; and configuring a first operating parameter based on the resistance value and a second operating parameter based on the capacitance value or a combination of the resistance value and the capacitance value.

10. The method of claim 9, wherein the combination of the resistance value and the capacitance value is a resistor-capacitor (RC) time constant associated with the resistor and the capacitor, wherein the RC time constant is a product of the resistance value and a capacitance value of the capacitor.

11. The method of claim 9, wherein the monitoring comprises determining a peak voltage, wherein the determining of the first value is based on the peak voltage.

12. The method of claim 9, wherein the monitoring comprises determining a decay time from a peak voltage or a predetermined voltage to a threshold voltage during a fall of the voltage signal, and wherein the determining of the second value is based on the decay time.

13. The method of claim 9, wherein the monitoring comprises determining a rise time to a threshold voltage during a rise of the voltage signal, wherein the determining of the second value is based on the rise time.

14. The method of claim 9, wherein the monitoring comprises measuring two voltages a fixed time apart during a rise or fall of the voltage signal, and wherein the determining of the second value is based on the two voltages.

15. The method of claim 9, wherein the configuring comprises:

configuring the first operating parameter to a first setting associated with a combination of the first value and the second value; and configuring the second operating parameter to a second setting associated with the first value, the second value, or the combination.

16. The method of claim 9, wherein the monitoring is performed using an analog-to-digital circuit (ADC) or a comparator.

* * * * *